(12) United States Patent
Su et al.

(10) Patent No.: US 11,362,055 B2
(45) Date of Patent: Jun. 14, 2022

(54) BUMP STRUCTURE OF THE SEMICONDUCTOR PACKAGE

(71) Applicant: Powertech Technology Inc., Hukou Township, Hsinchu County (TW)

(72) Inventors: Chih-Yen Su, Hukou Township, Hsinchu County (TW); Chun-Te Lin, Hukou Township, Hsinchu County (TW)

(73) Assignee: Powertech Technology Inc., Hukou Township (TW)

( * ) Notice: Subject to any disclaimer, the term of this patent is extended or adjusted under 35 U.S.C. 154(b) by 19 days.

(21) Appl. No.: 17/096,190

(22) Filed: Nov. 12, 2020

(65) Prior Publication Data
US 2022/0037274 A1    Feb. 3, 2022

(30) Foreign Application Priority Data

Aug. 3, 2020  (TW) .................................. 109126253

(51) Int. Cl.
*H01L 23/00*   (2006.01)
(52) U.S. Cl.
CPC .... *H01L 24/13* (2013.01); *H01L 2224/11526* (2013.01)

(58) Field of Classification Search
CPC ...................................................... H01L 24/13
See application file for complete search history.

(56) References Cited

U.S. PATENT DOCUMENTS 5,977,632 A * 11/1999 Beddingfield .......... H01L 24/81
257/737

\* cited by examiner

*Primary Examiner* — William A Harriston
(74) *Attorney, Agent, or Firm* — pattenttm.us

(57) ABSTRACT

The semiconductor package has a metal layer, a first dielectric layer formed on a metal layer, and an opening formed through the first dielectric layer to expose a part of the metal layer. The bump structure has an under bump metallurgy (hereinafter UBM), a first buffer layer and a metal bump. The UBM is formed on the first part of the metal layer, a sidewall of the opening and a top surface of the first dielectric layer. The first buffer layer is formed between a part of the UBM corresponding to the top surface of the first dielectric layer and the top surface of the first dielectric layer. The metal bump is formed on the UBM. Therefore, the first buffer layer effectively absorbs a thermal stress to avoid cracks generated in the bump structure after the bonding step.

19 Claims, 7 Drawing Sheets

BUMP STRUCTURE OF THE SEMICONDUCTOR PACKAGE

CROSS-REFERENCE TO RELATED APPLICATIONS

This application is based upon and claims priority under 35 U.S.C. 119 from Taiwan Patent Application No. 109126253 filed on Aug. 3, 2020, which is hereby specifically incorporated herein by this reference thereto.

BACKGROUND OF THE INVENTION

1. Field of the Invention

The present invention is related to a semiconductor package, and more particularly to a bump structure of a semiconductor package.

2. Description of the Prior Arts

In the semiconductor package, bump structures may be formed on a chip or a redistribution layer (hereafter RDL) and provide good conductivity. As an example of flip-chip semiconductor package, the bump structures are respectively formed on metal pads of the chip, so the chip may be directly bonded on a carrier. Therefore, the flip-chip semiconductor package can be smaller than a wire-bonded semiconductor package.

As a thickness of the chip 40 decreased, the chip 40 becomes bent after reflowing the bump structure 50 on the carrier 60, since the bump structure 50 is a multi-layer structure with different coefficients of thermal expansion (hereinafter CTE), as shown in FIG. 7. An outer layer of the bump structure 50 is a solder layer 51, and a heat melts the solder layer 51 with 220 to 240 degrees Celsius. From heating to cooling, different thermal stresses are occurred at a junction between each bump structure 50 and the chip 40, since multiple layers of the bump structure 50 have different CTEs, as shown in FIG. 8A. Thermal stresses cause torsion and bending. As shown in FIG. 8B, the different thermal stresses cause tension or compression at different junctions between the bump structures 50 and the chip 40. Finally, cracks may have occurred at the junction between the bump structure 50 and the chip 40. As shown in FIG. 9, the worst crack 42 even extends inward to a circuit layer 41 of the chip 40 to damage the circuit of the chip 40.

To overcome the shortcomings, the present invention provides a bump structure of a semiconductor package to mitigate or to obviate the aforementioned problems.

SUMMARY OF THE INVENTION

An objective of the present invention is to provide a bump structure of a semiconductor package.

To achieve the objective as mentioned above, the bump structure of the semiconductor package is formed on a first dielectric layer on a metal layer of the semiconductor package, wherein an opening is formed on the first dielectric layer corresponding to the metal layer, and the first dielectric layer has a first length. The bump structure has:

an under bump metallurgy (hereinafter UBM) formed on a part of the metal layer exposed the opening, an inside wall of the opening, and a top surface of the first dielectric layer, wherein a part of the UBM formed on the first dielectric layer has a second length;

a first buffer layer formed between the part of the UBM and the top surface of the first dielectric layer, wherein the first buffer layer has a third length and the third length is longer than the second length but short than the first length; and a metal bump formed on the UBM.

With the foregoing description, the present invention mainly provides the first buffer layer between the part of the UBM and the top surface of the first dielectric layer. The first buffer layer effectively absorbs thermal stress generated during the bonding step due to the different CTEs of the multi-layer materials of the bump structure and the cracks generated in the conventional bump structure after the bonding step is avoided.

Other objectives, advantages and novel features of the invention will become more apparent from the following detailed description when taken in conjunction with the accompanying drawings.

DETAILED DESCRIPTION OF THE PREFERRED EMBODIMENTS

With multiple embodiments and drawings thereof, the features of the present invention are described in detail as follows.

Figure 1A:
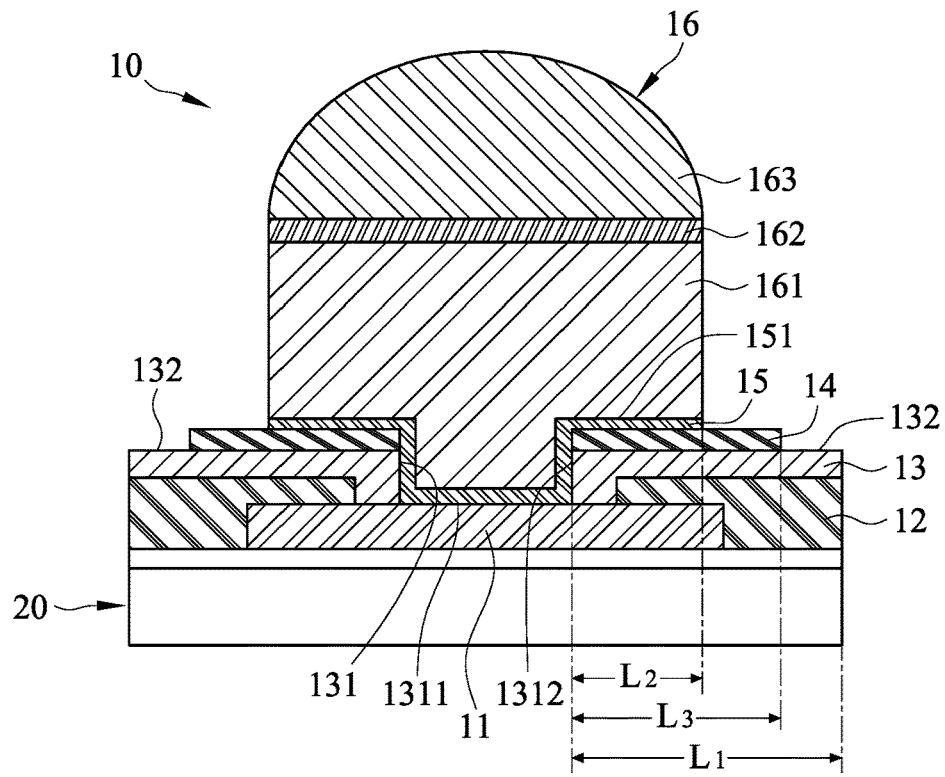
FIG. 1A is a cross-sectional view of a first embodiment of a bump structure of a semiconductor package in accordance with the present invention.

With reference to FIG. 1A, a first embodiment of a bump structure 10 of a semiconductor package is shown. The bump structure 10 is formed on a corresponding metal layer 11 of a chip 20. An insulation layer 12 covers the chip 20 and an outer part of the metal layer 11. A first dielectric layer 13 is formed on the insulation layer 12 and an exposed part of the metal layer 11. An opening 131 corresponding to the exposed part 1311 of the metal layer 11 is formed through the first dielectric layer 13. In one embodiment, the insulation layer 12 is made of PSV, and the first dielectric layer 13 is made of polyimide (PI) or Extreme low-K dielectric (ELK). The first dielectric layer 13 has a first length L1. In the preferred embodiment, the bump structure 10 has a first buffer layer 14, an UBM 15 and a metal bump 16.

The first buffer layer 14 is formed on a top surface 132 of the first dielectric layer 13. One end of the first buffer layer 14 and an inside wall 1312 are flush. The first buffer layer 14 has a third length L3 shorter than the first length L1 of the first dielectric layer 13. In the preferred embodiment, the Young's modulus of the first buffer layer 14 is lower than that of the first dielectric layer 13.

The UBM 15 is formed on the exposed part 1311 of the metal layer 11, the inside wall 1312 and a top of the first buffer layer 14. A part of the UBM 15 corresponding to the top surface 132 of the first dielectric layer 13 has a second length L2 shorter than that of the third length L3. Therefore, the first buffer layer 14 is formed between a part 151 of the UBM 15 on the top surface 132 of the first dielectric layer 13 and the top surface 132 of the first dielectric layer 13.

The metal bump 16 is formed on the UBM 15. In the preferred embodiment, the metal bump 16 has a copper (Cu) post layer 161, a barrier layer 162 (such as Ni barrier) and a solder paste layer 163 (SnAg solder tip) from bottom-to-top.

Based on the foregoing description of the first embodiment of the present invention, the bump structure 10 mainly has the first buffer layer 14 formed between the part of the UBM 15 corresponding to the top surface 132 of the first dielectric layer 13 and the top surface 132 of the first dielectric layer 13. The first buffer layer 14 is used to absorb thermal stress generated during the bonding step. Furthermore, to effectively absorb thermal stress, the first buffer layer 14 is made of a material with Young's modulus lower than that of the material of the first dielectric layer 13. The cracks generated in the conventional bump structure after the bonding step is avoided. The bump structure 10 is used on flip-chip of the semiconductor package and is shaped as a metal pillar.

Figure 1B:
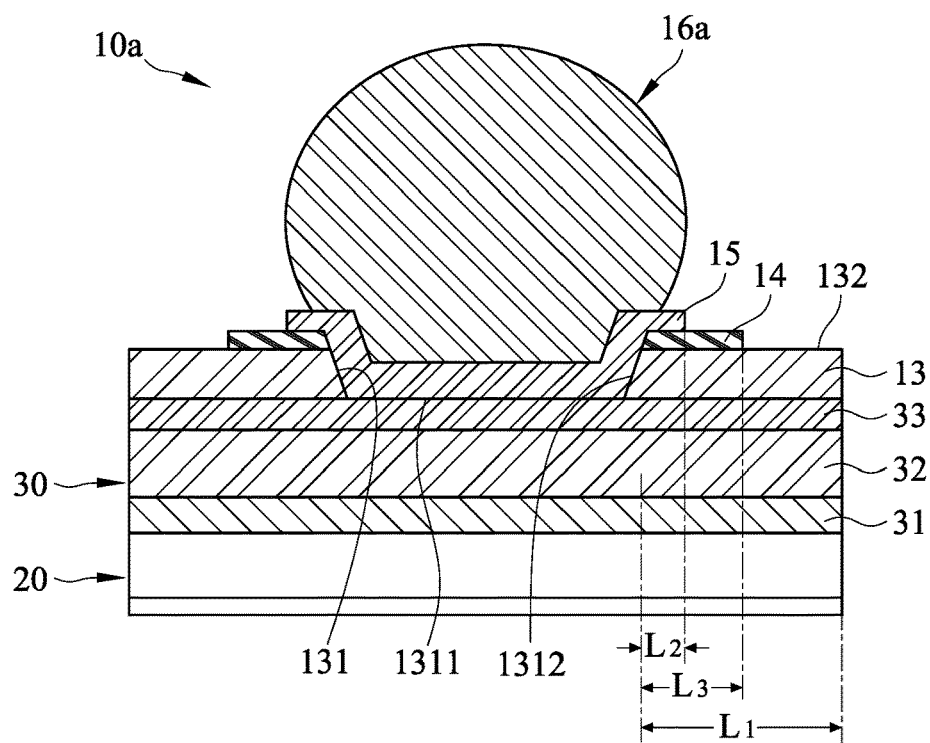
FIG. 1B is a cross-sectional view of a second embodiment of a bump structure of a semiconductor package in accordance with the present invention.

With reference to FIG. 1B, a second embodiment of a bump structure 10a of a semiconductor package is shown. In the preferred embodiment, the bump structure 10a is formed on an RDL 30 of a chip 20. The RDL 30 is formed on a surface of the chip 20 and has a passivation layer 31, a second dielectric layer 32, a metal layer 33 and a first dielectric layer 13 from bottom to top. An opening 131 corresponding to the metal layer 33 is formed through the first dielectric layer 13. The bump structure 10a is formed on an exposed part of the metal layer 33 corresponding to the opening 131 and has a first buffer layer 14, a UBM 15 and a metal bump 16a.

In the preferred embodiment, the first dielectric layer 13, the first buffer layer 14 and the UBM 15 of the bump structure 10a are the same as these of the bump structure 10 as shown in FIG. 1A, but the metal bump 16a formed on the UBM 15 differs from that of the bump structure 10 as shown in FIG. 1A. In the preferred embodiment, the metal bump 16a is a solder ball.

Based on the foregoing description of the second embodiment, the bump structure 10 mainly has the first buffer layer 14 formed between the part of the UBM 15 corresponding to the top surface 132 of the first dielectric layer 13 and the top surface 132 of the first dielectric layer 13. The first buffer layer 14 is used to absorb thermal stress generated during the bonding step. Furthermore, to effectively absorb thermal stress, the first buffer layer 14 is made of a material with Young's modulus lower than that of the first dielectric layer 13. The cracks generated in the bump structure after the bonding step is avoided.

Figure 2:
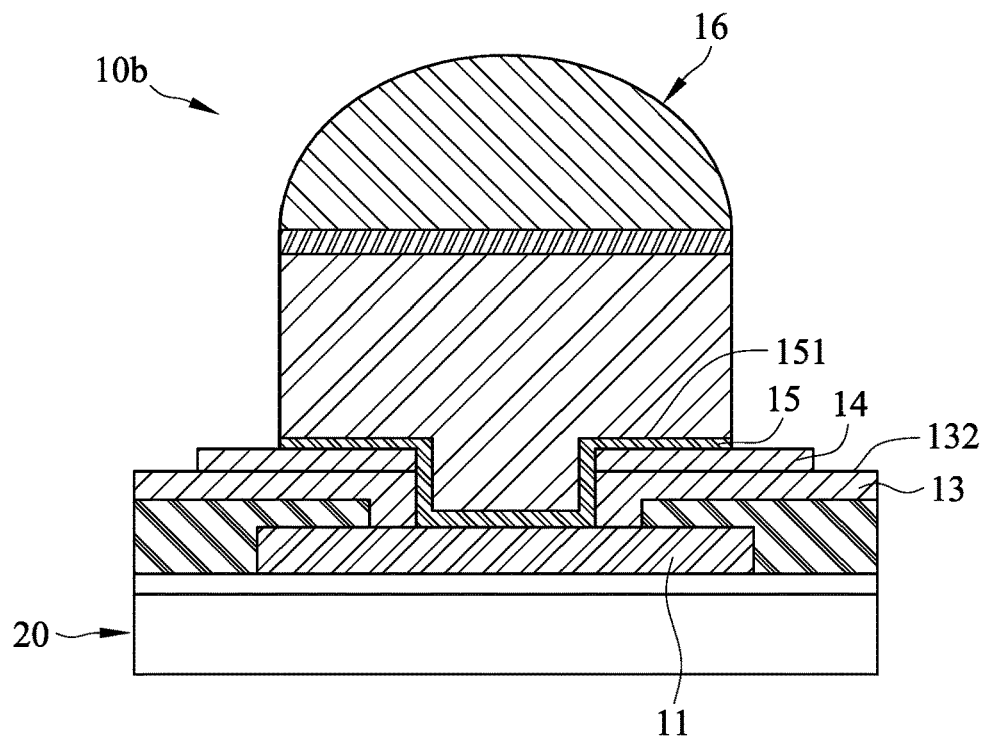
FIG. 2 is a cross-sectional view of a third embodiment of a bump structure of a semiconductor package in accordance with the present invention.

With reference to FIG. 2, a third embodiment of a bump structure 10b of the semiconductor package is shown. The bump structure 10b is similar to the bump structure 10 as shown in FIG. 1A, but a material of a first buffer layer 14 is the same as that of a first dielectric layer 13. In other words, since the first buffer layer 14 is formed between the part 151 of the UBM 15 and the top surface 132 of the first dielectric layer 13, a thickness of the first dielectric layer 13 is increased and the increased part of the first dielectric layer 13 is used as the first buffer layer 14. The increased part of the first dielectric layer 13 effectively absorbs thermal stress during the bonding step. The cracks generated in the bump structure after the bonding step is avoided. The bump structure 10b is used on flip-chip of the semiconductor package and is shaped as a metal pillar.

Figure 3:
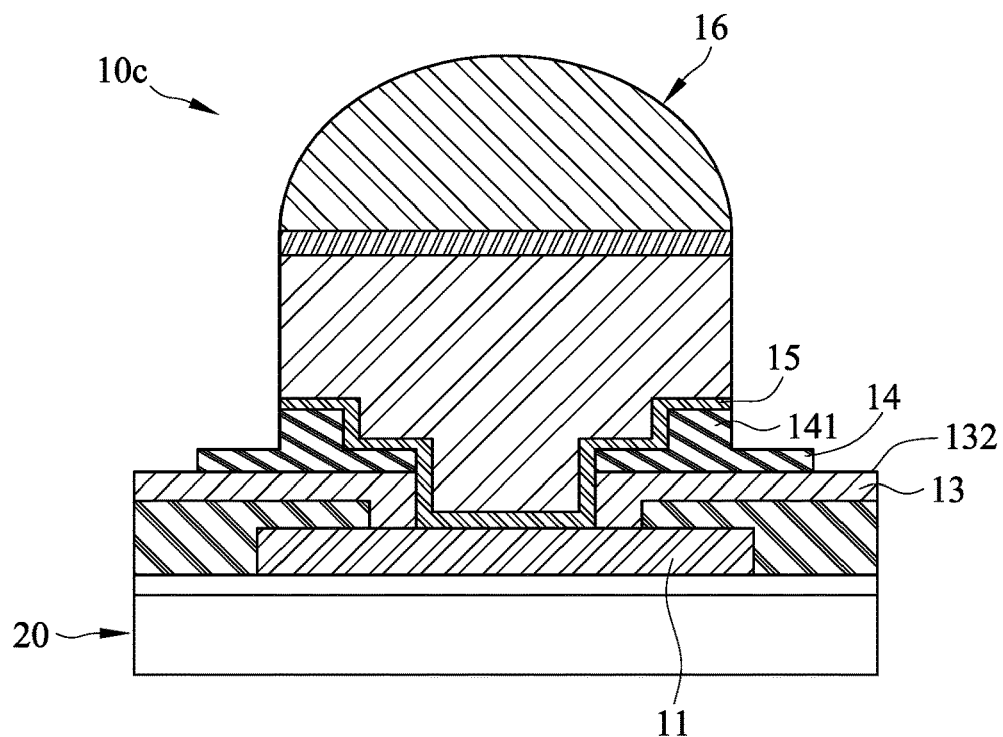
FIG. 3 is a cross-sectional view of a fourth embodiment of a bump structure of a semiconductor package in accordance with the present invention.
Figure 4A:
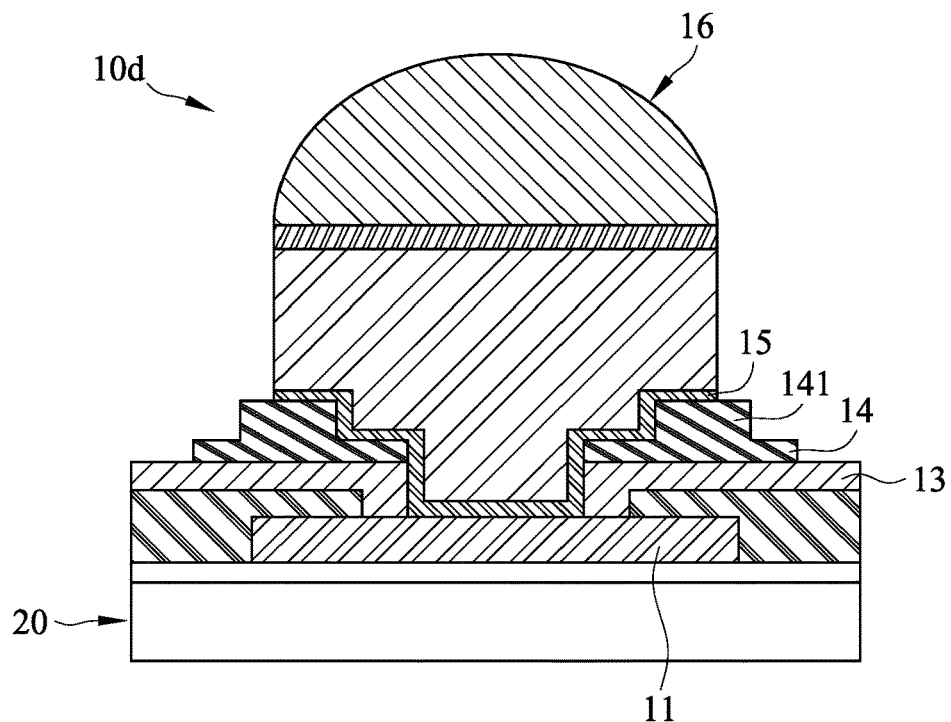
FIG. 4A is a cross-sectional view of a fifth embodiment of a bump structure of a semiconductor package in accordance with the present invention.

With reference to FIG. 3, a fourth embodiment of a bump structure 10c of the semiconductor package is shown. The bump structure 10c is similar to the bump structure 10 as shown in FIG. 1A, but a first buffer layer 14 of the bump structure 10c further has a protruding part 141. The protruding part 141 extends from a top of the first buffer layer 14 and faces the part of the UBM 15 corresponding to the top surface 132 of the first dielectric layer 13. In the preferred embodiment, an outer end of the protruding part 141 and a sidewall of the metal bump 16 are flush. In a fifth embodiment of the present invention of FIG. 4A, an outer end of a protruding part 141 of a first buffer layer 14 further extends laterally. In one embodiment, the material of the first buffer layer 14 of the bump structure 10c or 10d is the same as that of the first dielectric layer 13.

Based on foregoing description of the fourth and fifth embodiments, a junction area between the first buffer layer 14 with the protruding part 141 and the part of the UBM 15 corresponding to the top surface 132 of the first dielectric layer 13 is increased to increase a bonding strength therebetween. In addition, a thickness of the first buffer layer 13 with the protruding part 141 is increased to effectively absorb thermal stress during the bonding step. The cracks generated in the bump structures 10c, 10d after the bonding step are avoided. The bump structures 10c, 10d are also used on flip-chip of the semiconductor package and are shaped as a metal pillars.

Figure 4B:
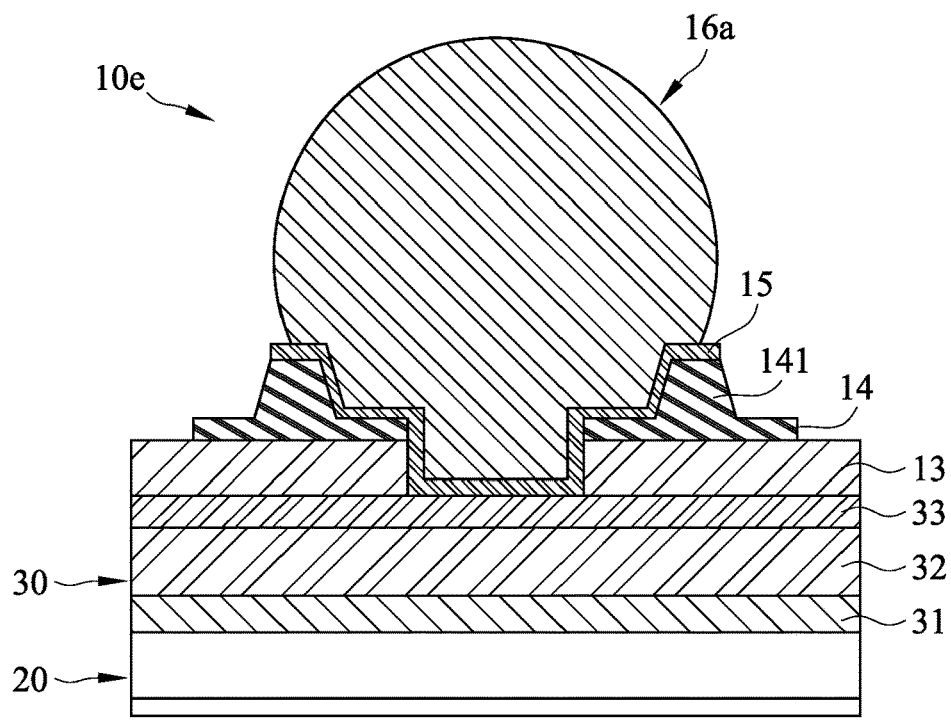
FIG. 4B is a cross-sectional view of a sixth embodiment of a bump structure of a semiconductor package in accordance with the present invention.

With reference to FIG. 4B, a sixth embodiment of a bump structure 10e of the semiconductor package is shown. The bump structure 10e is similar to the bump structure 10a as shown in FIG. 1B, but a bump structure 10e has a protruding part 141 extending from a top of the bump structure 10e and a metal bump 16a is a solder ball. The protruding part 141 of the bump structure 10e may be the same as the protruding part 141 of FIGS. 3 and 4A. In the preferred embodiment, the material of the first buffer layer 14 is the same as that of the first dielectric layer 13.

Based on the foregoing description of the sixth embodiment, a junction area between the first buffer layer 14 with the protruding part 141 and the part of the UBM 15 corresponding to the top surface 132 of the first dielectric layer 13 is increased to increase a bonding strength therebetween. In addition, a thickness of the first buffer layer 14 with the protruding part 141 is increased to absorb thermal stress during the bonding step effectively. The cracks generated in the bump structure 10c, 10d after the bonding step is avoided. The bump structures 10e is also used on an RDL of the semiconductor package.

Figure 5:
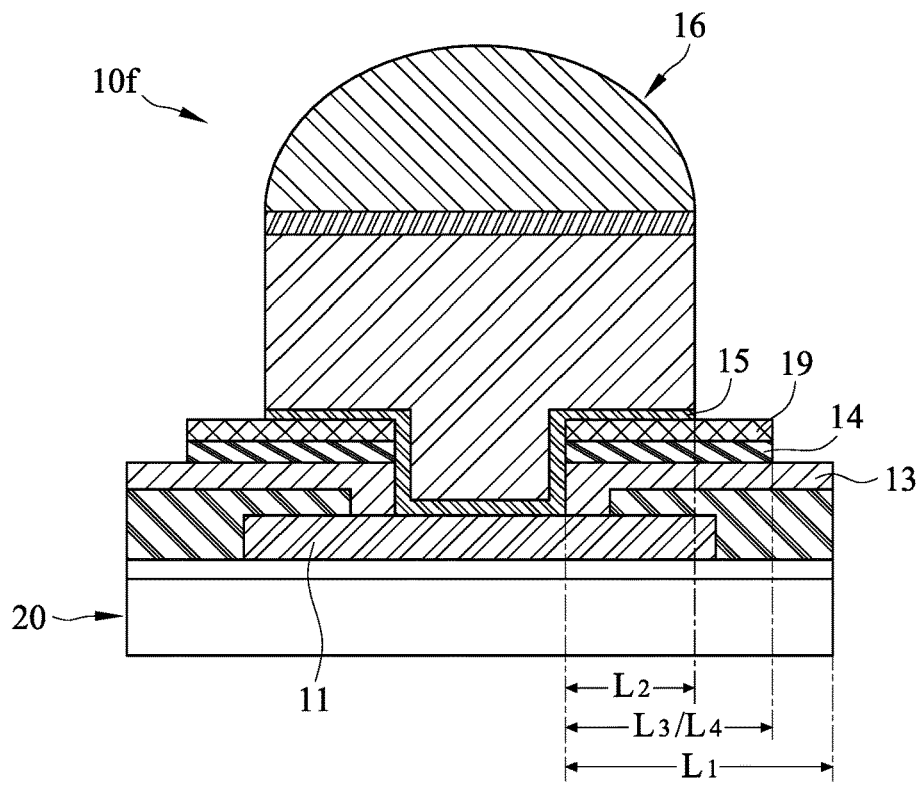
FIG. 5 is a cross-sectional view of a seventh embodiment of a bump structure of a semiconductor package in accordance with the present invention.
Figure 6:
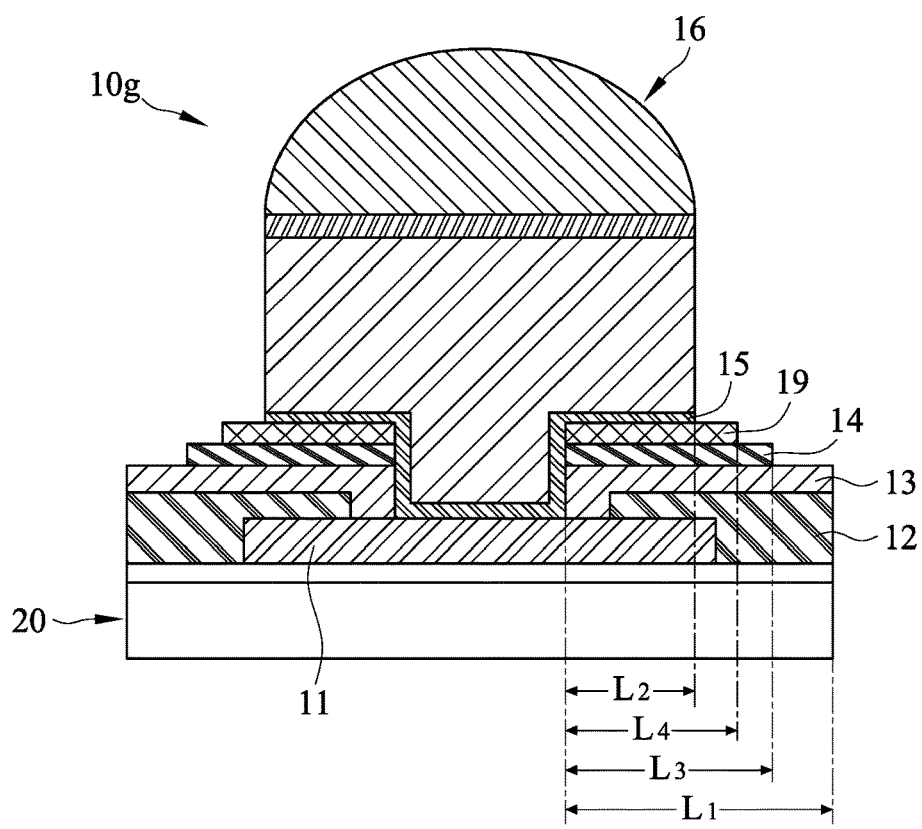
FIG. 6 is a cross-sectional view of an eighth embodiment of a bump structure of a semiconductor package in accordance with the present invention.
Figure 7:
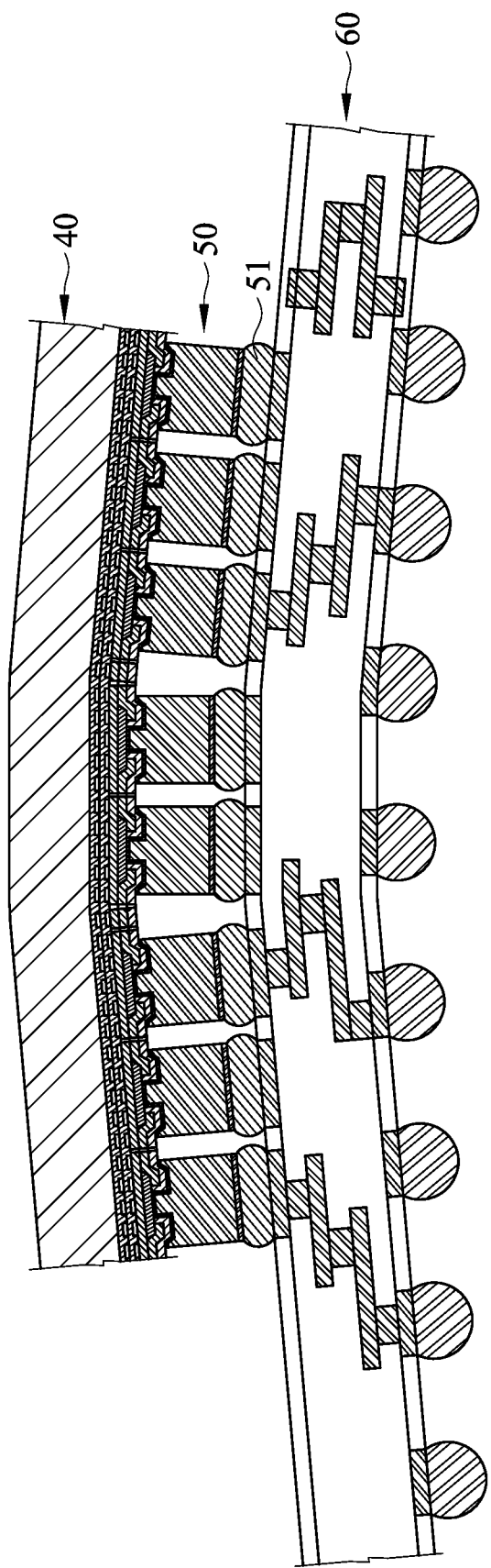
FIG. 7 is a cross-sectional view of a conventional semiconductor package in accordance with the prior art.
Figure 8A:
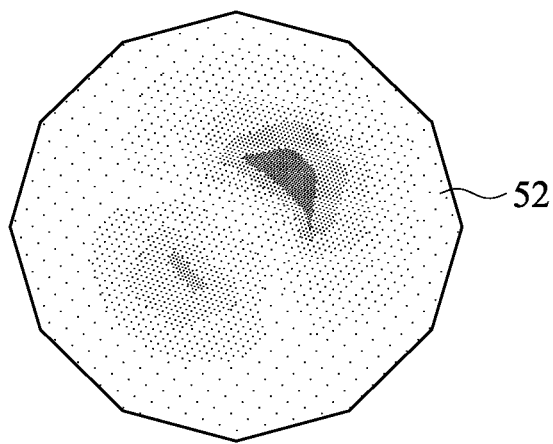
FIG. 8A is a thermal stress distribution diagram at a junction of the bump structure and chip.
Figure 8B:
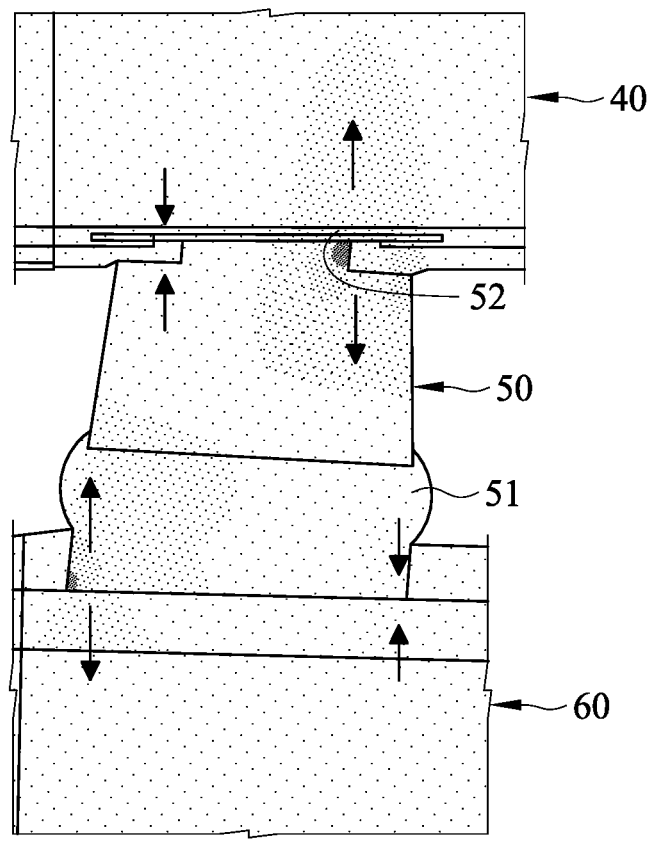
FIG. 8B is a thermal stress distribution diagram of a side of the bump structure and chip.
Figure 9:
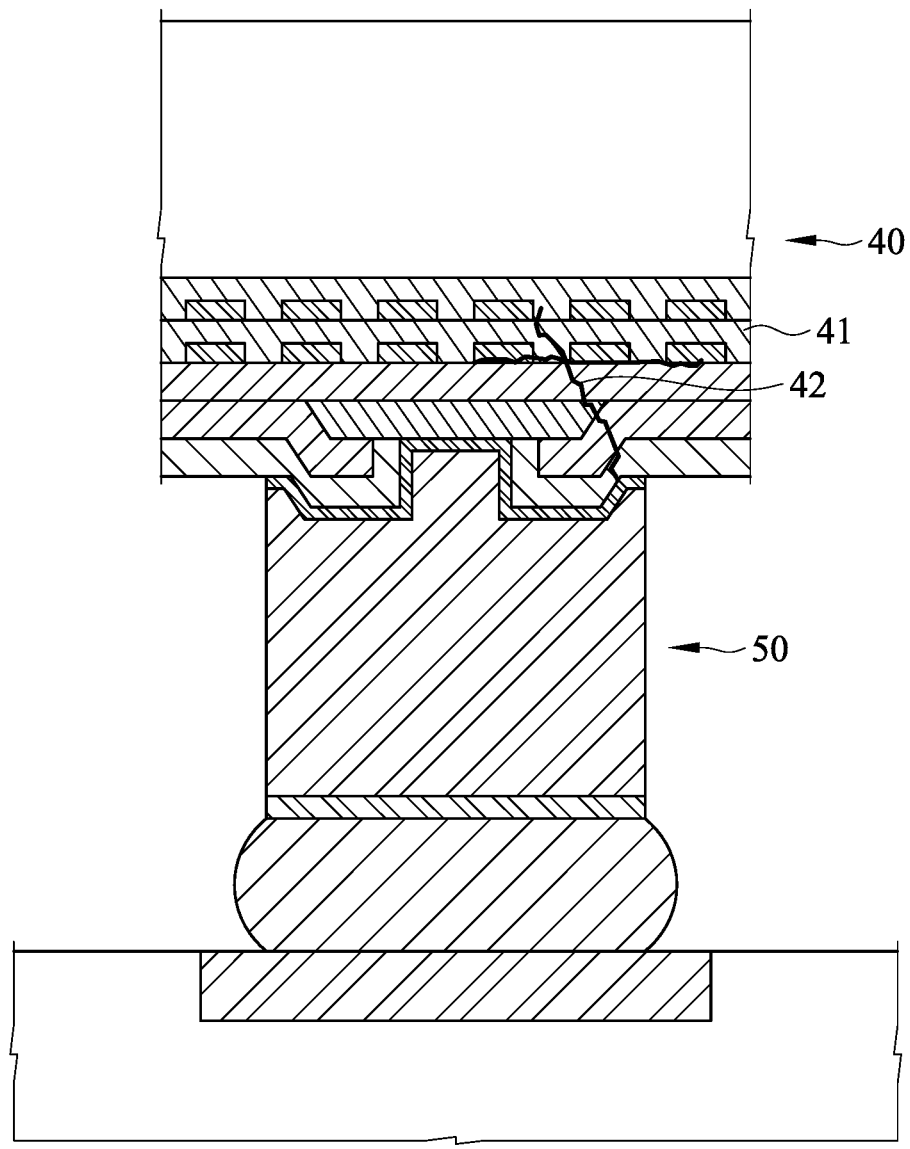
FIG. 9 is a cross-sectional view of a conventional semiconductor package in accordance with the prior art.

With reference to FIG. 5, a seventh embodiment of a bump structure 10f of the semiconductor package is shown. The bump structure 10f is similar to the bump structure 10 as shown in FIG. 1A, but the bump structure 10f further has a second buffer layer 19 formed between the first buffer layer 14 and the part of UBM 15 corresponding to the top surface 132 of the first dielectric layer 13. The second buffer layer 19 has a fourth length L4, same as the third length L3 of the first buffer layer 14. In an eighth embodiment of the present invention as shown in FIG. 6, a fourth length L4 of a second buffer layer 19 of a bump structure 10g is shorter than the third length L3 of the first buffer layer 14 and longer than the second length L2 of the part of UBM 15 corresponding to the top surface 132 of the first dielectric layer 13.

Based on foregoing description of the seventh and eighth embodiments, a total thickness of the first and second buffer layers 14, 19 is larger than the thickness of the first buffer layer 14, so the bump structures 10f, 10g effectively absorb thermal stress during the bonding step. The cracks generated in the bump structures 10f, 10g after the bonding step are avoided. The bump structures 10f, 10g are also used on flip-chip of the semiconductor package and are shaped as metal pillars.

With the foregoing descriptions of the embodiments, the present invention mainly provides the first buffer layer between the part of the UBM corresponding to the top surface of the first dielectric layer and the top surface of the first dielectric layer. The first buffer layer effectively absorbs thermal stress generated during the bonding step due to the different CTEs of the multi-layer materials of the bump structure and the cracks generated in the bump structure after the bonding step is avoided. In addition, when the Young's modulus of the first buffer layer 14 is lower than that of the first dielectric layer 13, an elasticity of the buffer layer is higher than that of the first dielectric layer to absorb thermal stress effectively. Furthermore, the second buffer layer is formed on a junction of the first buffer layer and the part of the UBM, so an effect of absorbing thermal stress is relatively increased. The first buffer layer may have the protruding part to increase the junction area between the first buffer layer 14 and the part of the UBM 15 to increase a bonding strength therebetween.

Even though numerous characteristics and advantages of the present invention have been set forth in the foregoing description, together with the details of the structure and features of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A bump structure of a semiconductor package having a metal layer, a first dielectric layer formed on the metal layer and an opening formed through the first dielectric layer to expose a first part of the metal layer, wherein the first electric layer has a first length and the bump structure comprises:
   an under bump metallurgy (hereinafter UBM) formed on the first part of the metal layer, a sidewall of the opening and a top surface of the first dielectric layer, wherein the UBM has a second part corresponding to the top surface of the first dielectric layer and the second part has a second length;
   a first buffer layer formed between the second part of the UBM and the top surface of the first dielectric layer, wherein the first buffer layer has a third length that is longer than the second length and shorter than the first length;
   a second buffer layer formed between the first buffer layer and the second part of the UBM; and
   a metal bump formed on the UBM.

2. The bump structure of the semiconductor package as claimed in claim 1, wherein a material of the first buffer layer is the same as that of the first dielectric layer.

3. The bump structure of the semiconductor package as claimed in claim 2 further comprising a protruding part extending from a top of the first buffer layer and facing the second part of the UBM.

4. The bump structure of the semiconductor package as claimed in claim 2 further comprising a second buffer layer formed between the first buffer layer and the second part of the UBM.

5. The bump structure of the semiconductor package as claimed in claim 4, wherein
   the second buffer layer has a fourth length;
   the fourth length is shorter than or the same as the third length of the first buffer layer; and
   the fourth length is longer than the second length of the UBM.

6. The bump structure of the semiconductor package as claimed in claim 2, wherein the first dielectric layer is made of Polyimide or Extreme Low-K Dielectric.

7. The bump structure of the semiconductor package as claimed in claim 2, wherein the metal bump is a solder ball or a metal pillar.

8. The bump structure of the semiconductor package as claimed in claim 7, wherein the metal pillar comprises has a copper post layer, a barrier layer and a solder paste layer.

9. The bump structure of the semiconductor package as claimed in claim 1, wherein a Young's modulus of the first buffer layer is lower than that of the first dielectric layer.

10. The bump structure of the semiconductor package as claimed in claim 9 further comprising a protruding part extending from a top of the first buffer layer and facing the second part of the UBM.

11. The bump structure of the semiconductor package as claimed in claim 9 further comprising a second buffer layer formed between the first buffer layer and the second part of the UBM.

12. The bump structure of the semiconductor package as claimed in claim 11, wherein
   the second buffer layer has a fourth length;
   the fourth length is shorter than or the same as the third length of the first buffer layer; and
   the fourth length is longer than the second length of the UBM.

13. The bump structure of the semiconductor package as claimed in claim 9, wherein the first dielectric layer is made of Polyimide or Extreme Low-K Dielectric.

14. The bump structure of the semiconductor package as claimed in claim 9, wherein the metal bump is a solder ball or a metal pillar.

15. The bump structure of the semiconductor package as claimed in claim 1 further comprising a protruding part extending from a top of the first buffer layer and facing the second part of the UBM.

16. The bump structure of the semiconductor package as claimed in claim 1, wherein
   the second buffer layer has a fourth length;
   the fourth length is shorter than or the same as the third length of the first buffer layer; and the fourth length is longer than the second length of the UBM.

17. The bump structure of the semiconductor package as claimed in claim 1, wherein the first dielectric layer is made of Polyimide or Extreme Low-K Dielectric.

18. The bump structure of the semiconductor package as claimed in claim 1, wherein the metal bump is a solder ball or a metal pillar.

19. The bump structure of the semiconductor package as claimed in claim 18, wherein the metal pillar comprises has a copper post layer, a barrier layer and a solder paste layer.

* * * * *